US006996187B2

(12) United States Patent
Perner

(10) Patent No.: US 6,996,187 B2
(45) Date of Patent: Feb. 7, 2006

(54) METHOD AND APPARATUS FOR DATA TRANSMISSION

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 757 days.

(21) Appl. No.: 09/999,382

(22) Filed: Oct. 31, 2001

(65) Prior Publication Data

US 2002/0097804 A1     Jul. 25, 2002

(30) Foreign Application Priority Data

Oct. 31, 2000 (DE) ............................ 100 54 094

(51) Int. Cl.
*H04L 27/00* (2006.01)
(52) U.S. Cl. ............... 375/259; 375/243; 375/286; 365/233; 365/63
(58) Field of Classification Search ............... 375/259, 375/243, 286; 710/53, 68; 327/536; 365/233, 365/63
See application file for complete search history.

(56) References Cited

U.S. PATENT DOCUMENTS

| 5,793,815 | A | | 8/1998 | Goodnow et al. ........... 375/286 |
| 6,249,482 | B1 | * | 6/2001 | Albon et al. ................ 365/233 |
| 6,324,602 | B1 | * | 11/2001 | Chen et al. .................... 710/68 |
| 6,335,873 | B1 | * | 1/2002 | Kawaguchi et al. .......... 365/63 |
| 6,556,065 | B1 | * | 4/2003 | Keeth et al. ................. 327/536 |

* cited by examiner

*Primary Examiner*—Shuwang Liu
(74) *Attorney, Agent, or Firm*—Laurence A. Greenberg; Werner H. Stemer; Ralph E. Locher

(57) ABSTRACT

A method and an apparatus for transmitting data on an internal and/or external transfer path in and/or to a semiconductor component such as a semiconductor memory, in which, a first coder/decoder codes a data sequence by stipulating a signal level of a data signal that is transmitted on a transfer path in sync with a clock signal. A second coder/decoder decodes the transmitted data signal by assessing the signal level in order to ascertain the original data sequence. In addition to the coded data signal, a reference signal block having at least one reference signal level is transmitted. The reference signal level is compared with the signal level of the transmitted coded data signal in the second coder/decoder in order to assess the signal level.

18 Claims, 7 Drawing Sheets

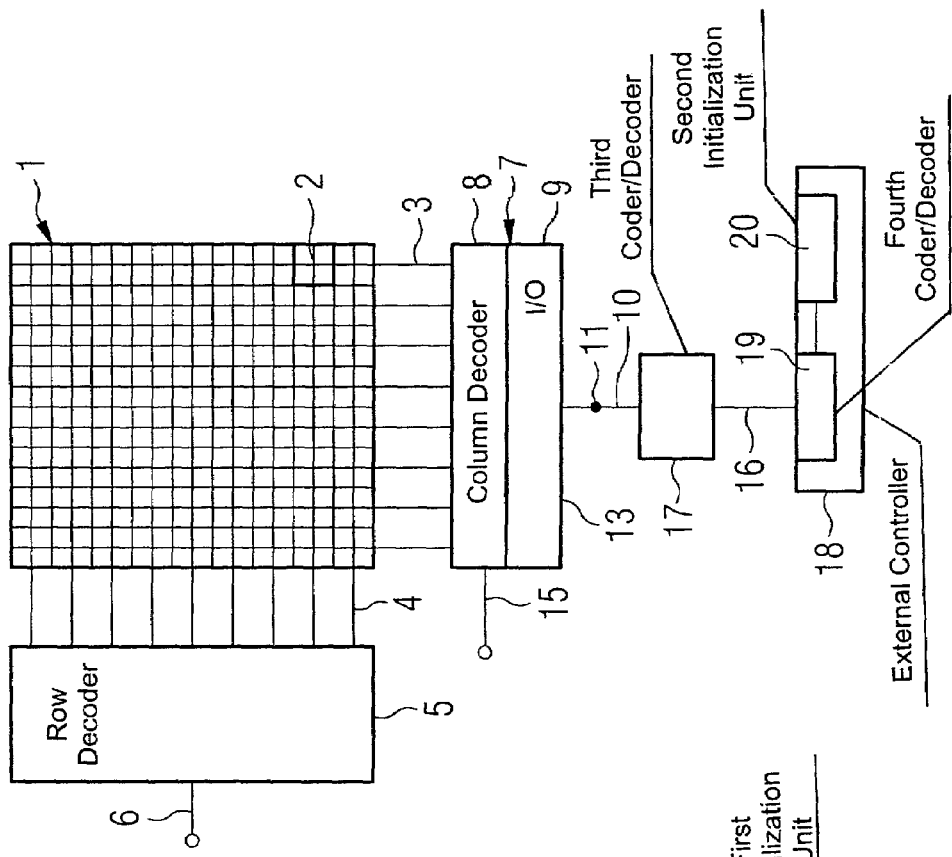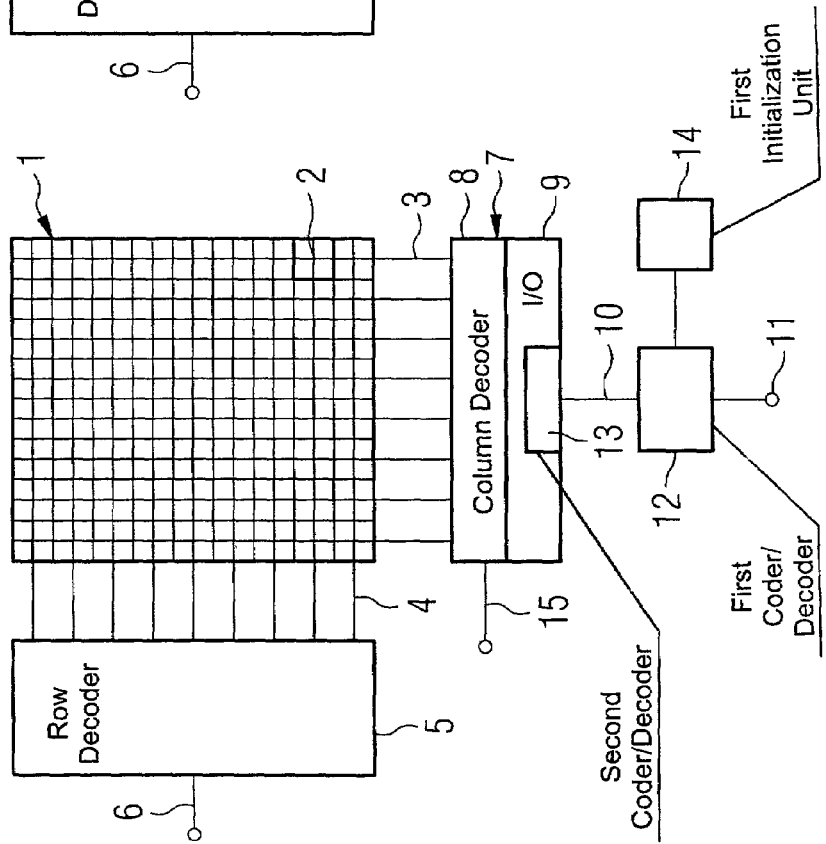

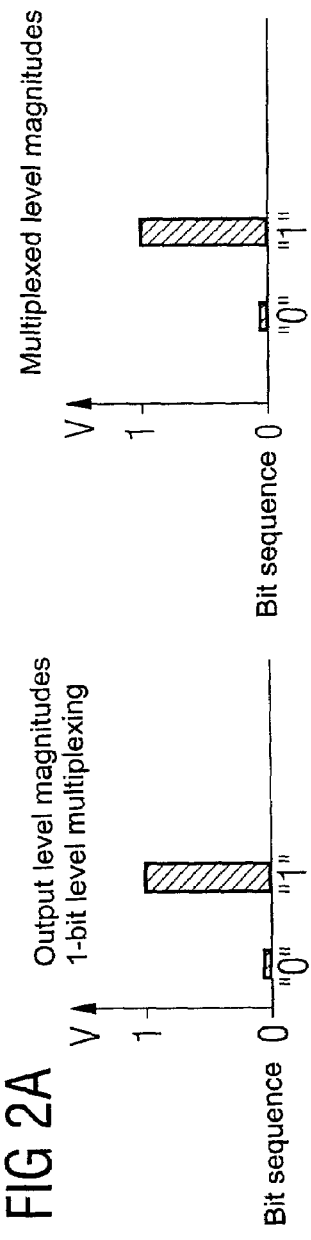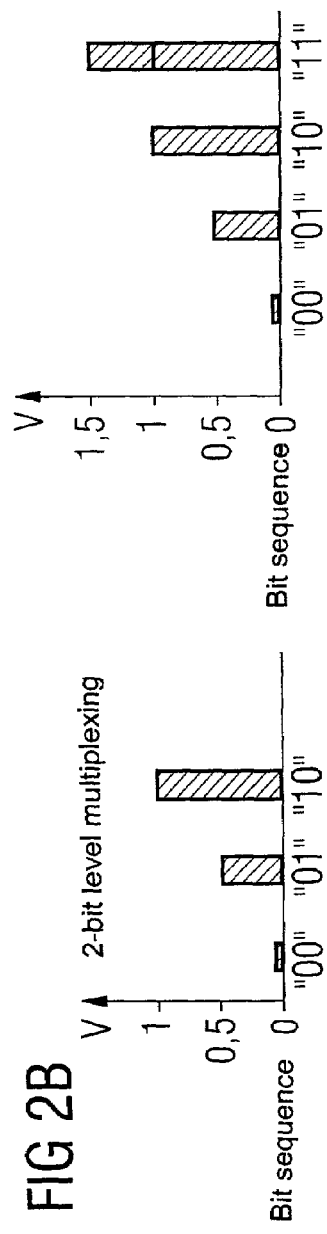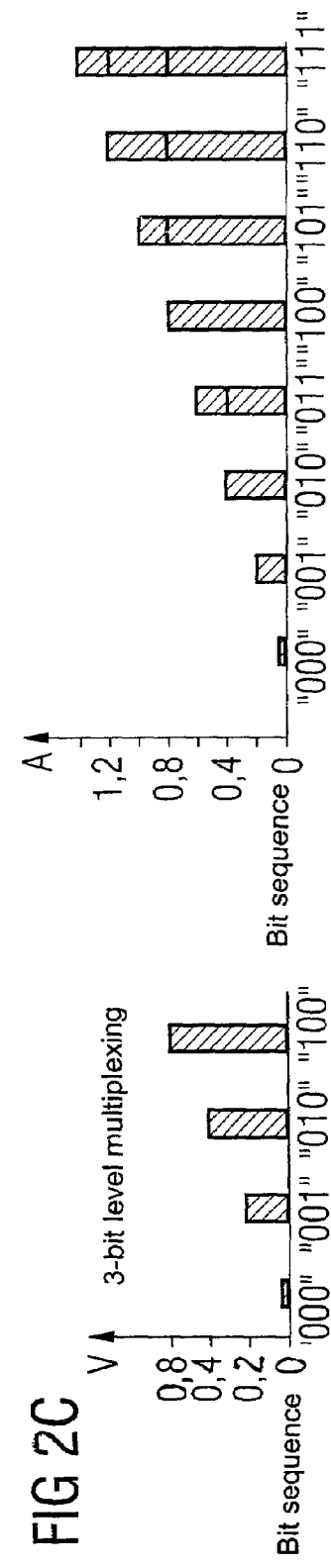

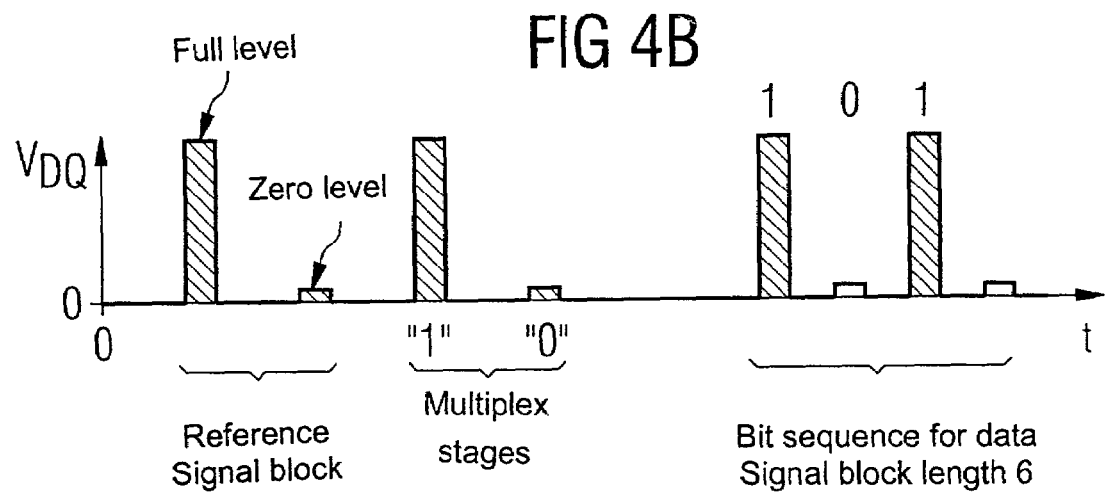
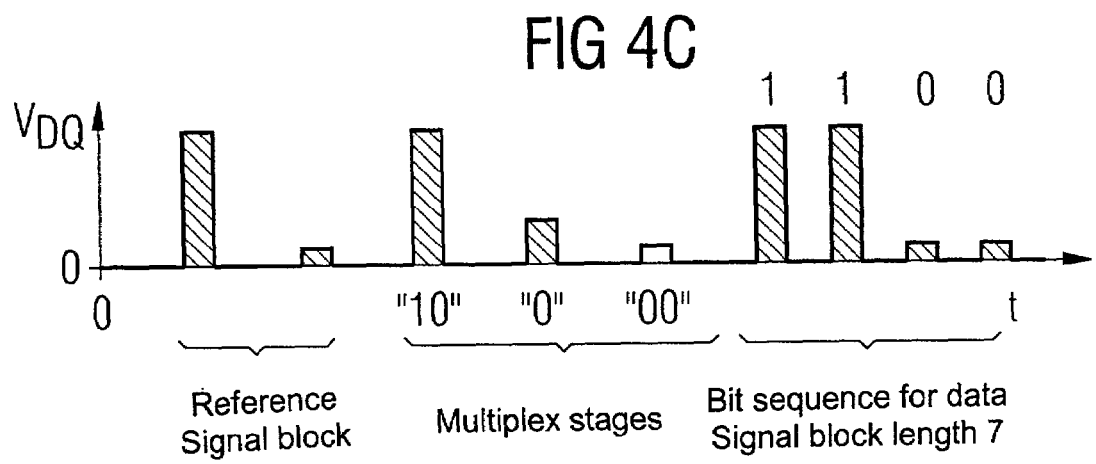

METHOD AND APPARATUS FOR DATA TRANSMISSION

BACKGROUND OF THE INVENTION

Field of the Invention

The invention relates to a method for data transmission on an internal and/or external transfer path in and/or to a semiconductor component, in particular a semiconductor memory. The invention also relates to a corresponding data transmission apparatus, in which a data sequence is coded by stipulating a signal level for a data signal. The data signal is then transmitted in sync with a clock signal, and the data signal is then decoded by assessing the signal level in order to ascertain the transmitted data sequence.

The rapid progress in semiconductor technology has made it possible to develop processors for computers with a clock rate in the gigahertz range. To be able to use such processors effectively, the semiconductor memories interchanging data with the processor also need to operate with similarly high data transfer rates. The semiconductor memories used for data interchange with processors or controllers are, in particular, read/write memories with random access (RAM), in which data can be read in and out as often as desired. In this context, the read/write memories are either in the form of static memories (SRAM), in which the written data can be stored for as long as desired when an operating voltage is applied, or are in the form of dynamic memories (DRAM), in which the data in the memory cells need to be refreshed at cyclic intervals. DRAMs have significant advantages over SRAMs when the memory cells are integrated, and are therefore the preferred semiconductor memories in computers.

Data transmission with the RAM conventionally takes place in sync with the system clock. In this context, normally, for each data input/output of the RAM, a bit signal is transmitted in sync with the system clock within a clock cycle. In that case, with a prescribed maximum voltage level of 3.3 V, for example, a 0 V signal applied on a rising pulse edge of the system clock signifies a logic "0", and a 3.3 V signal signifies a logic "1". In order to be able to assess the transmitted signal level reliably even when signal transmission is subject to interference, the possible level range is conventionally quantified in two stages and is respectively interpreted as a bit signal. In this context, by way of example, a signal level range from 0 V to 1.65 V then defines a signal level for a logic "0", and a signal level range from 1.66 V to 3.3 V defines a signal level for a logic "1".

To increase the data transfer rate further as compared with such conventional synchronous DRAMs, the company Rambus has developed a data transmission method in which the DRAMs can be operated at a doubled data rate. In this method, for each clock cycle in the DRAM, a respective bit signal is transmitted both on a rising pulse edge and on a falling pulse edge of the system clock and is assessed by the memory module.

However, the constantly rising processing speed of processors means that it is necessary to increase the data transfer rate to or in the semiconductor memories further, in particular in the case of synchronously operating DRAMs. To achieve this, it is possible to increase the system clock rate for the data transmission, but limitations arise for the maximum possible clock rate in this context, on account of radio-frequency effects. In addition, to increase the data transfer rate, it is also possible to increase the number of parallel data inputs/outputs of the semiconductor memory. In this case, however, the normally prescribed chip size stipulates production limitations.

To increase the data transfer rate for synchronous DRAMs further, Rambus has proposed (cf. http://www.eetimes.com/story/OEG20000623650045) transmitting two bit signals in sync at the same time for each data input/output of the DRAM, in each case on a rising pulse edge and a falling pulse edge of the system clock. This is achieved by virtue of four signal levels being used for level assessment, in which case, by way of example, a signal level of 0 V to 0.5 V is then assessed as bit sequence "00", a signal level of 0.5 V to 1 V is assessed as bit sequence "01", a signal level of 1 V to 1.5 V is assessed as bit sequence "10", and a signal level of 1.5 V to 2 V is assessed as bit sequence "11". This signal level multiplexing technique with four signal levels to be assessed is used to increase the data transfer rate again by a factor of 2 as compared with the conventional Rambus DRAM.

In principle, the signal level multiplexing method provides the opportunity to increase the data transfer rate further if additional signal levels were to be used for signal coding. However, one problem is presented in this context by the fact that only a limited maximum level is available for data transmission. If, then, further signal levels are to be used for signal coding, the interval between the individual level magnitudes becomes so small that interference from the transfer path means that the memory module is no longer able to detect the individual signal levels cleanly. This is because, in particular, signal attenuation and signal noise affected by the level background can cause the transmitted signal to be distorted, which makes clean signal resolution impossible.

U.S. Pat. No. 5,793,815 discloses a multilevel data transmission method in which a reference signal is transmitted in addition to the multiplexed data signal, with initialization being carried out using a test signal.

SUMMARY OF THE INVENTION

It is accordingly an object of the invention to provide a method and an apparatus for transmitting data on a transfer path in a semiconductor memory which overcomes the above-mentioned disadvantages of the prior art apparatus and methods of this general type. In particular, it is an object of the invention to provide a method and an apparatus for transmitting data on a transfer path in a synchronous DRAM, which can be used to increase the data transfer rate easily and reliably.

With the foregoing and other objects in view there is provided, in accordance with the invention, a method for transmitting data on a transfer path of a semiconductor component that includes steps of: coding a data sequence to set a signal level of a data signal and thereby obtaining a coded data signal having the signal level; transmitting the coded data signal on the transfer path in sync with a clock signal; on the transfer path, transmitting a reference signal block having at least one reference signal level; decoding the transmitted coded data signal by assessing the signal level of the transmitted coded data signal and thereby ascertaining the data sequence; performing the step of assessing the signal level of the transmitted coded data signal by comparing the reference signal level with the signal level of the transmitted coded data signal; and initializing the step of transmitting the coded data signal on the transfer path by transmitting a test data sequence to set a feature selected from the group consisting of an optimum number of multiplexed data signals that are in a data signal block and an optimum number of multiplex steps for stipulating signal levels of the multiplexed data signals.

According to the invention, a data sequence is coded by stipulating a signal level for a data signal. The data signal is then transmitted in sync with a clock signal, and the data signal is then decoded again by assessing the signal level in order to ascertain the transmitted data sequence, where, in addition to the coded data signal, a reference signal block having at least one reference level is transmitted. The reference level is compared with the signal level of the coded data signal in order to evaluate the signal level.

The inventive signal coding enables multilevel multiplexing to be carried out in which only a small signal separation between the individual level magnitudes is required, since the signal level referencing carried out independently of the maximum level and level background means that clean level resolution is ensured even with a small level separation.

In addition, according to the invention, the number of data signals in the data signal block and/or the number of multiplexed level magnitudes is stipulated such that a test data sequence is output onto the transfer path by a transmitter as a predetermined number of data signals having a predetermined number of multiplexed signal levels. The multiplexed signal levels of the data signals are assessed on the basis of the at least one reference signal in the previously transmitted reference signal block in order to decode the test data sequences at a receiver. Next, the decoded test data sequence is then coded again at the receiver, is transmitted back to the transmitter together with the reference signal block and is decoded again by the transmitter in order to establish whether a correct transmission operation has been carried out between transmitter and receiver. Depending on the result, the number of data signals and/or the number of multiplex steps for the signal level in the data signal block is then iteratively adjusted in a prescribed step sequence until a maximum data transfer rate is obtained at which the individual transmitted data signals that have been transmitted between the transmitter and the receiver are still transmitted and received in a error free manner; in other words, until the transmitted data signals still have an error-free signal level assessment carried out for them. This initialization operation provides a simple way of optimally adjusting the data transfer rate in or to the semiconductor component to the signal quality.

In accordance with one advantageous embodiment, only one reference signal having the maximum possible level magnitude is transmitted in the reference signal block. The minimum level adopted is a zero level which remains unaffected by the data transmission. The reference signal is transmitted alternately with a data signal both on a rising pulse edge and a falling pulse edge of a system clock. The alternate transmission of the reference signal and the data signal provides for a simple transfer protocol in which the direct comparison of the successive reference signals and data signals allows signal attenuation and interference affected by the level background to be reliably detected and corrected.

In accordance with another preferred embodiment, a reference signal having the minimum possible level magnitude is transmitted in the reference signal block alternately with a reference signal having the maximum possible level magnitude. This allows the absolute value of the possible level range to be established easily, and hence allows level referencing, which is independent of the respective level magnitude, to be carried out. In addition, interference as a result of signal attenuation and increased level background can be reliably detected and corrected.

In accordance with another preferred embodiment, the reference signal block has a signal sequence including a reference signal with a maximum possible signal level and a reference signal with a minimum possible signal level. The reference signal block is transmitted alternately with a data signal block including a prescribed number of data signals, and the prescribed number of data signals in the data signal block is stipulated on the basis of the quality of the data signals. This technique makes it possible to set a maximum data transfer rate and at the same time to take steps to ensure that signal multiplexing is independent of interference signals.

In accordance with another preferred embodiment, the number of data signals in the data signal block and/or the number of multiplexed level magnitudes is stipulated such that a test data sequence is output onto the transfer path by a transmitter as a predetermined number of data signals having a predetermined number of multiplexed signal levels. The multiplexed signal levels of the data signals are assessed on the basis of the at least one reference signal in the previously transmitted reference signal block in order to decode the test data sequences at a receiver. Next, the decoded test data sequence is then coded again at the receiver, is transmitted back to the transmitter together with the reference signal block, and is decoded again by the transmitter in order to establish whether a correct transmission operation has been carried out between the transmitter and the receiver. Depending on the result, the number of data signals and/or the number of multiplex steps for the signal level in the data signal block is then iteratively adjusted in a prescribed step sequence until a maximum data transfer rate is obtained at which the individual transmitted data signals are still transmitted between the transmitter and the receiver in a error free manner; in other words until the transmitted data signals still have an error-free signal level assessment carried out for them. This initialization operation provides a simple way of optimally adjusting the data transfer rate in or to the semiconductor component to the signal quality.

With the foregoing and other objects in view there is provided, in accordance with the invention, an apparatus for transmitting data on a transfer path of a semiconductor component. The apparatus includes: a first coder/decoder for coding a data sequence by setting a signal level of a data signal and thereby obtaining a coded data signal having the signal level, the first coder/decoder also designed to produce a reference signal block having at least one reference signal level; a bi-directional transfer path for transmitting the coded data signal in sync with a clock signal and for transmitting the reference signal level; a second coder/decoder for decoding the transmitted coded data signal by assessing the signal level of the transmitted coded data signal to ascertain the data sequence that has been transmitted, the second coder/decoder designed to compare the signal level of the transmitted coded data signal with the reference signal level in order to assess the signal level of the transmitted coded data signal; and an initialization unit for initializing data transmission on the transfer path in order to transmit a test data sequence bi-directionally between the first coder/decoder and the second coder/decoder. The initialization unit assesses a result of the transmission of the test data sequence to set a feature selected from the group consisting of an optimum number of multiplexed data signals in a data signal block and an optimum number of multiplex steps. The feature is for stipulating a signal level of the multiplexed data signals.

Other features which are considered as characteristic for the invention are set forth in the appended claims.

Although the invention is illustrated and described herein as embodied in a method and apparatus for data transmission, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A shows the basic design of a RAM with inventive internal signal-multiplexed data transmission;
FIG. 1B shows the basic design of a RAM with inventive external signal-multiplexed data transmission;
FIG. 2A to FIG. 2C show the principle of data coding by signal level multiplexing using three signal coding examples;
FIG. 4B and FIG. 4C show a possible start test transfer protocol and a possible varied test transfer protocol for the initialization method shown in FIG. 4A.

DESCRIPTION OF THE PREFERRED EMBODIMENTS

Figure 3A:
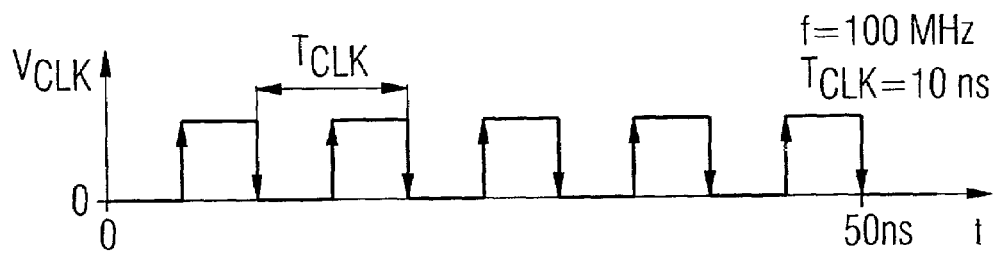
FIG. 3A to FIG. 3D show a system clock profile and three possible inventive data transfer protocols.

Referring now to the figures of the drawing in detail and first, particularly, to FIG. 1A thereof, there is shown the basic design of a read/write memory with random access (RAM) in the form of a matrix memory. In this case, the memory matrix 1 is composed of a multiplicity of memory cells 2 located at the points of intersection of xy address lines, the "bit lines" 3 and "word lines" 4. These memory cells 2 can store data bits. The word lines 4 are connected to a row decoder 5. This row decoder 5 decodes the row addresses applied via the row address line 6. The bit lines 3 are connected to a control unit 7 which has a column decoder 8 which decodes the column addresses applied via a column address line 15. The control unit 8 also has an input/output circuit 9 which contains write amplifiers and read amplifiers and is used to implement a desired function for a memory cell 2 that is selected using the row and column addresses, i.e. for writing to a memory cell 2 and for reading from a memory cell 2. The input/output circuit 9 is connected to the data inputs/outputs 11 of the semiconductor memory by means of data transmission lines 10. FIG. 1A shows only one data input/output with a transfer path by way of example. Besides the connections on the control unit 8 which are shown in FIG. 1A, further connections are provided for inputting control data, depending on the design of the RAM.

To allow fast internal data transmission from the data input/output 11 to the input/output circuit 9, a first coder/decoder 12 is provided at data input/output 11, and a second coder/decoder 13 is provided at the end of the internal data transfer path 10 in the input/output circuit 9. These first and second coders/decoders 12, 13 are used to perform signal level multiplexing on the internal data transfer path 10. The signal level multiplexing is used to achieve a high data transfer rate on the transfer path 10 in the RAM. In this context, the respective transfer protocol used for signal level multiplexing is set using a first initialization unit 14 connected to the first coder/decoder 12.

The RAM shown in FIG. 1A may be in the form of a static RAM, in which the data are held in the memory cells for the entire length of time for which an operating voltage is applied, or in the form of a dynamic RAM, in which the data in the memory cells need to be refreshed cyclically. Besides such semiconductor memories, the inventive signal level multiplexing method may also, in principle, be used for other semiconductor components in which module-internal data transmission is required, however.

FIG. 1B shows a second embodiment of a RAM, in which signal level multiplexing is performed on an external data transfer path 16 between the data input/output 11 of the RAM and an external controller 18. To this end, the data input/output 11 of the RAM has an external third coder/decoder 17 connected upstream of it. In addition, the external controller 18 has a fourth coder/decoder 19 to which a second initialization unit 20 is connected. This design allows external data transmission from a processor or from the external controller 18 to the RAM, and this can be performed in a similar manner to the internal data transmission shown in FIG. 1A. In addition, it is also possible for the external data transmission to the RAM and the internal data transmission in the RAM to be carried out using a signal level multiplexing technique, in which case a design is then chosen which corresponds to a combination of the RAM design embodiments shown in FIG. 1A and FIG. 1B. In the case of the design shown in FIG. 1B, the second initialization unit 20 is used to adjust the transfer protocol used for external data transmission to be in line with the data input/output 11 of the RAM. Instead of being connected upstream of the data input/output 11, the third coder/decoder 17 may also be integrated therein.

The principle of signal level multiplexing, as can be used both for the internal data transmission in the RAM, shown in FIG. 1A, and for the external data transmission to the RAM, shown in FIG. 1B, is illustrated in FIG. 2. For signal level multiplexing, the signal levels of a data sequence are combined to form a joint signal level at the transmission end and are transmitted as a multiplex signal, which is then broken down again into the individual signal levels of the data sequence at the reception end.

FIG. 2A shows 1-bit level multiplexing with two different voltage levels. In this case, the voltage level 0 V represents a logic "0", and the voltage level 1 V represents a logic "1". These two voltage levels can be used to transmit precisely one 1-bit information item per data signal via the data transmission lines 10, 16. In this case, the signal separation $$\Delta V = V_{Level,Max} - V_{Level,Min}$$

between the two possible signal levels corresponds to the maximum possible signal level $V_{Level,Max}=1$ V if $V_{Level,Min}=0$ V is the minimum level.

If, as shown in FIG. 2B, three voltage levels are used for level multiplexing, data transmission for each data signal is possible using a 2-bit information item. In this context, the 0 V voltage level corresponds to a logic bit sequence "00", for example. The 0.5 V voltage level corresponds to a logic bit sequence "01", and the 1 V voltage level corresponds to a logic bit sequence "10". These three levels can be used to produce a multiplex signal having four different level magnitudes, in which case the voltage level 0 V then represents the bit sequence "00", the voltage level 0.5 V represents the bit sequence "01", the voltage level 1 V represents the bit sequence "10", and the voltage level 1.5 V represents the bit sequence "11". In this case, the signal separation ΔV for this 2-bit level multiplexing is $$\Delta V = V_{Level,Max}/2^2 - 1 = 1.5\ V/3$$

if $V_{Level,Min} = 0$ V is the minimum level.

Similarly, as shown in FIG. 2C, 3-bit level multiplexing can be carried out using a maximum level of 1.4 V, where the 0.2 V component represents a bit sequence "001", the 0.4 V component represents a bit sequence "010", and the 0.8 V component represents a bit sequence "100". The possible number of level magnitudes with this 3-bit level multiplexing is, as also shown in FIG. 2C, eight, where a signal separation $$\Delta V = V_{Level,Max}/2^3 - 1 = 1.6\ V/7$$

is obtained if $V_{Level,Min} = 0$ V is the minimum level.

In general, signal level multiplexing by putting together n+1 individual signal levels makes it possible to combine n binary information items in one multiplexed signal level, giving two $2^n$ different level magnitudes for which the signal separation between the individual level magnitudes is then $$\Delta V = (V_{Level,Max} - V_{Level,Min})/(2^n - 1)$$

However, one difficulty which remains for signal level multiplexing in a RAM is that there is only a limited voltage level range available, which means that, particularly when 4-bit level multiplexing is carried out, only a small signal separation is produced between the individual level magnitudes on the basis of the formula cited above.

So that it is also possible to carry out signal level resolution which is independent of signal interference in that case, in accordance with the invention, a reference signal block having a reference signal is transmitted in addition to the data signal block having the multiplexed signal level. The reference signal is then used as a comparison level for resolving the multiplexed signal levels of the transmitted data signals in the data signal block.

As one exemplary embodiment, data signal transmission with a multiplexed data signal block and a reference signal block is illustrated for a RAM with synchronous data transmission. Synchronous data transmission means that the signals are transmitted in sync with the system clock, which is generally prescribed by a processor or controller connected to the RAM, and the transmitted signal levels are assessed on the pulse edges of the system clock signal. In the conventional data transmission method in synchronous RAMs, one data signal per data input/output connection is transmitted in sync with the clock signal, on the rising pulse edge thereof. In accordance with one variant used by Rambus, it is also possible to transmit a data signal additionally on the falling pulse edge of the system clock as well, which makes it possible to double the data transfer rate.

Figure 3B:
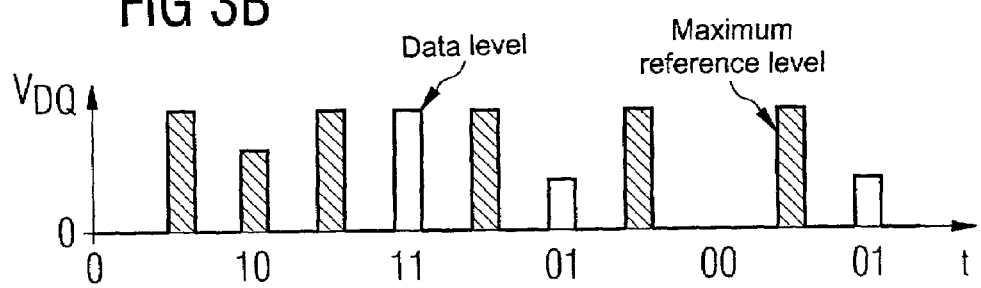

FIGS. 3A–3D show three possible data transfer protocols for data transmission with a data signal block, containing multiplexed signal levels, and a reference signal block, where two-bit level multiplexing is carried out-and a system clock having a frequency of 100 MHz with a clock period of 10 ns is used. The system clock signal is shown in FIG. 3A. FIG. 3B shows a first transfer protocol, in which the reference signal block includes a single reference signal with the maximum possible reference level swing. The reference signal is respectively transmitted within a system clock cycle on the rising pulse edge. By contrast, the data signal with the 2-bit-multiplexed signal level is always transmitted on the falling pulse edge within the system clock cycle. Comparison of the maximum level with the multiplexed signal level allows signal level resolution of the data signal independently of signal interference. Within the context of this comparison, the reference signal zero level is defined at 0 V. The data transfer protocol shown allows a data transfer rate of 200 Mbit/s.

Figure 3C:
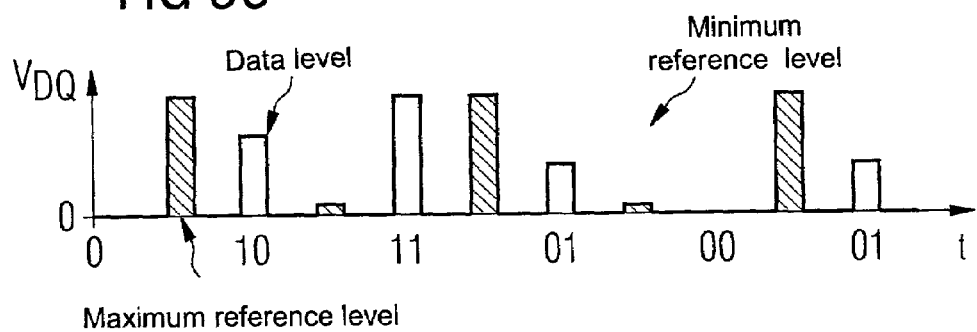

FIG. 3C shows a second possible data transfer protocol, in which a reference signal having a maximum reference level and a reference signal having a minimum reference level are transmitted alternately on the rising pulse edge. The multiplexed data signals are in turn transmitted on the falling pulse edges. With this transfer protocol, the multiplexed signal levels of the data signals are compared with the absolute value of the reference signal level swing, obtained from the maximum reference signal level minus the minimum reference signal level. This reliably ensures that level referencing which is independent of the maximum level and of the level background is achieved for the data signals, and hence reliable signal resolution of the multiplexed data level is carried out. This data transfer protocol in turn also permits a data transfer rate of 200 Mbit/s.

Figure 3D:
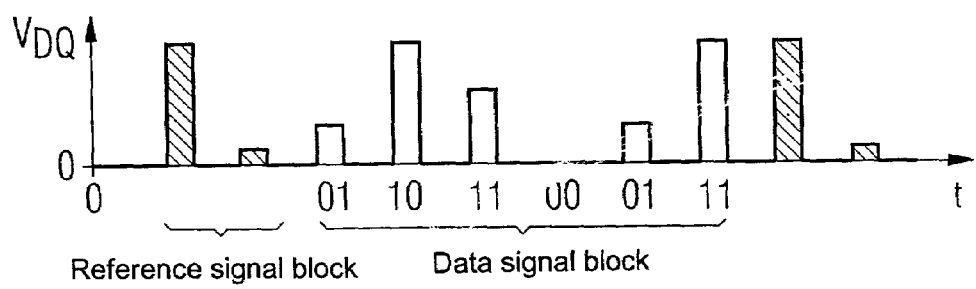

FIG. 3D shows another possible data transfer protocol with a reference signal block and a data signal block having multiplexed signal levels. In this case, the reference signal block includes two successive reference signals, the first reference signal transmitted being a full signal swing as the maximum reference level, and the second reference signal transmitted being a zero level as the minimum reference level. In this context, the reference signal block is transmitted within one system clock cycle on the rising or falling pulse edge. After the reference signal block, a data signal block having a prescribed number of data signals with multiplexed signal levels is then transmitted. In this case, these data signals are transmitted in sync with the clock signal on the rising and falling pulse edges. After this data signal block, a reference signal block and then a data signal block are then transmitted again, which results in cyclic data transmission of reference signal block and data signal block. For evaluation purposes, the respectively transmitted reference signal block is used to determine the absolute level swing which is independent of the level background, and this level swing is used to evaluate the subsequent data signals with the multiplexed signal level. Transmitting a relatively large data signal block between the reference signal blocks allows a much higher data transfer rate to be achieved as compared with the transfer protocols described above. In the embodiment shown, with six multiplexed data signals between a reference signal block, a data transfer rate of 3200 Mbit/s is thus obtained.

Figure 4A:
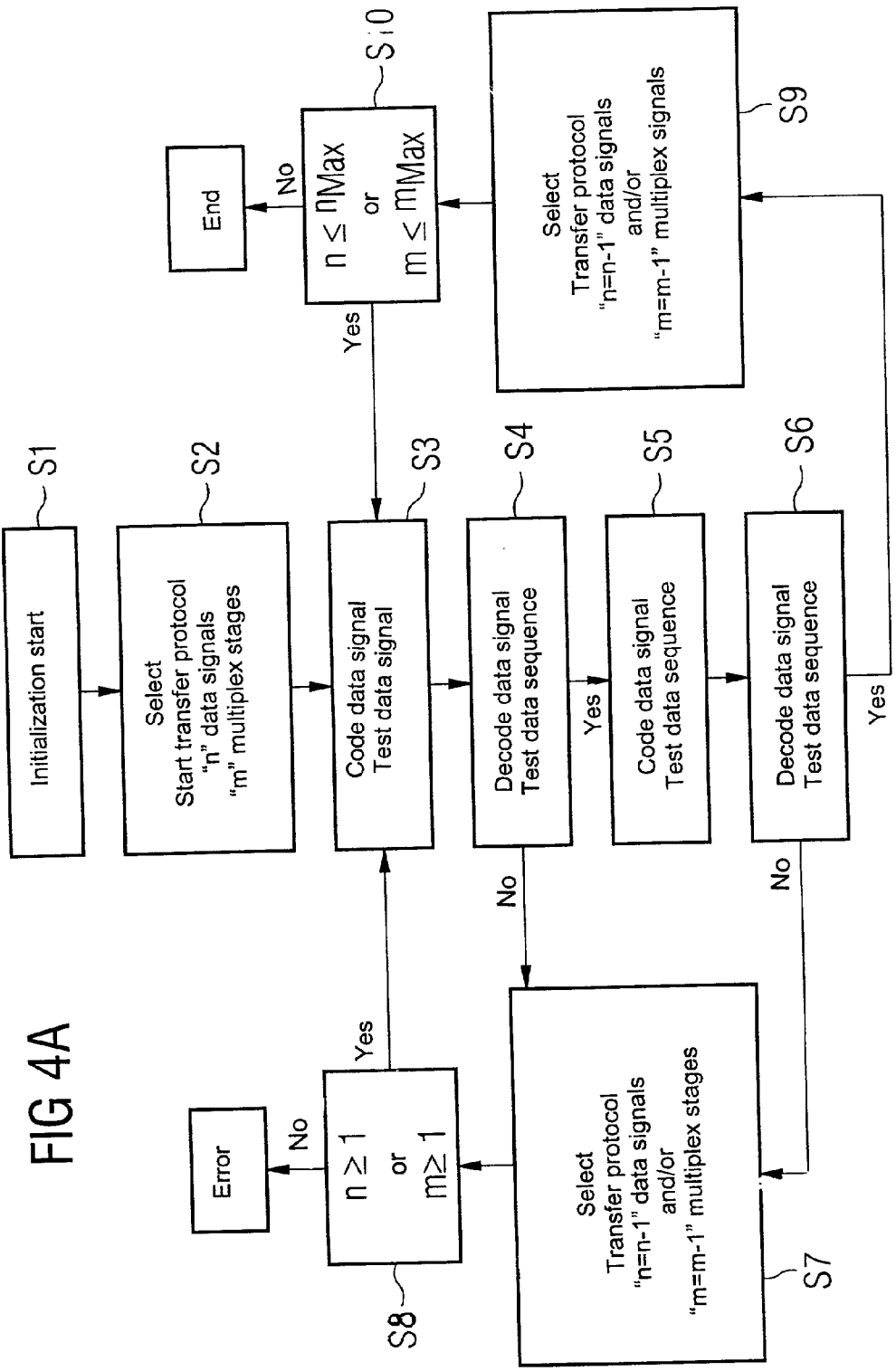
FIG. 4A shows a method for initializing an inventive data transfer protocol.

The data transfer protocol used for data transmission between the first coder/decoder 12 and the second coder/decoder 13 on the internal data transfer path 10 or between the third coder/decoder 17 and the fourth coder/decoder 19 on the external data transfer path 16 can be selected on the basis of the quality of the signals injected via the data input/output 11 or the controller 18. In this case, the data transfer protocol is preferably stipulated using an initialization step controlled by the first or second initialization unit 14, 20. One possible sequence for the initialization operation for stipulating a data transfer protocol is shown in FIG. 4A. FIG. 4B shows a start test transfer protocol, and FIG. 4C shows a varied test transfer protocol during an initialization pass. The initialization operation is described below for the RAM design with internal multiplexed data transmission, shown in FIG. 1A. It can naturally also be used for the RAM design with external multiplexed data transmission, shown in FIG. 1B, or for a RAM design with internal and external multiplexed data transmission (not shown).

The initialization operation is started with step S1. In this context, step S1 can be executed before the actual startup of data transmission, that is to say when the appliance containing the RAM, generally a computer, is started. The initialization operation can be initiated, for example, by applying the operating voltage to the RAM in order to initialize the RAM-internal data transmission or by applying the operating voltage to the controller or processor in order to initialize the RAM-external data transmission. In addition, the initialization can also be repeated at stipulated intervals of time during ongoing RAM operation, i.e. when data transmission in or to the RAM is taking place, or else when the processor or controller or a monitoring unit (not shown) in the RAM establishes that an error has arisen in the internal or external data transmission.

After the initialization operation has started in step S1, the first initialization unit 14 selects a start transfer protocol, one possible exemplary embodiment of which is shown in FIG. 4. The start transfer protocol prescribes a reference signal block, the multilevel coding, i.e. the number m of level magnitudes to be multiplexed, in the embodiment shown 2-bit multiplexing, and the number n of multiplexed data signals, in the embodiment shown a bit sequence stipulating 6 data signals. The first initialization unit 14 transfers this start transfer protocol together with a test data sequence to the first coder/decoder 12. The first coder/decoder 12 then codes the test data sequence in step S3 based on the prescribed start transfer protocol to form data signal blocks having multiplexed signal levels. Each data signal block includes the particular number n of data signals having m-bit-multiplexed signal levels, based on the prescribed transfer protocol. The multiplexed data signal blocks are then transmitted alternately with the associated reference signal blocks, as shown for the transfer protocol in FIG. 3C, via the internal transfer path 10 to the second coder/decoder 13. The second coder/decoder 13 decodes the received data signals having a multiplexed signal level by comparing the data signals with the absolute value of the level swing obtained from the transmitted reference block.

If an error occurs in this decoding operation, shown as step S4 in FIG. 4A, the decoding operation is terminated and an error message is sent back to the first initialization unit 14 via the transfer path 10 and the first coder/decoder 12. The first initialization unit then selects, in step S7, a new transfer protocol which uses a data signal block having a multiplexed data signal sequence whose number n of data signals and/or whose multiplex step m is reduced by a unit, one in the embodiment shown, as compared with the previously chosen data signal block. At the same time, the first initialization unit 14 checks, in step S8, whether the number n or the multiplex step m of the multiplexed data signals then obtained in the data signal block is greater than zero. If this is the case, the new transfer protocol is transmitted together with the test signal data to the first coder/decoder 12, which then performs signal coding and transmission on the basis of the chosen transfer protocol again. A varied test transfer protocol with three-bit level multiplexing and seven data signals in the data signal block is shown in FIG. 4C.

If, in step S8, the first initialization unit 14 establishes that the number n of data signals in the transfer protocol's data signal block or the multiplex step m is zero, the initialization method is terminated and an error message is output by the first initialization unit 14.

If, in step S4, no error is established when decoding the multiplexed signal levels in the transmitted data signal block, the decoded test data sequence is converted back by the second coder/decoder unit 13, based on the varied test transfer protocol that was selected by the first initialization unit 14, into a data signal block with multiplexed data signals in step S5, and is transmitted alternately with the reference signal block via the internal transfer path 10 to the first coder/decoder 12 based on the transfer protocol. The first coder/decoder 12 then evaluates the received data signals with the multiplexed signal level in step S6 on the basis of the predetermined reference signals, in order to obtain the original test data sequence again therefrom. If the received signal levels are not understood by the first coder/decoder 12, the procedure moves to step S7 again and the initialization unit 14 selects a new transfer protocol with a data signal block having a reduced number n of data signals or a reduced number m of multiplex steps. The process sequence illustrated above is then repeated.

If all the multiplexed signal levels are understood by the first coder/decoder 12 in step S6, the successful decoding is reported back to the first initialization unit 14, which then selects, in step S9, a new data transfer protocol with an increased number of data signals or an increased number m of multiplexed signal levels in the data signal block. If step S10 reveals that the resultant number n of data signals or multiplex steps m is greater than the maximum permissible number, initialization is terminated. Otherwise, a new transmission pass with the test data sequence is initiated by the first initialization unit 14 using the newly stipulated transfer protocol. The initialization sequence illustrated is a simple way of optimally selecting the data transmission on the basis of a prescribed signal quality in the RAM, which allows a maximum possible data transfer rate to be used in the RAM.

As an alternative to the initialization method shown in FIG. 4, instead of setting both the number n of data signals and the level magnitude m available for the multiplex operation, it is also possible to adjust only one of these variables during initialization, with the other variable being set permanently. In addition, the number of data signals or the multiplex steps m can be incremented in any step sequence.

Figure 5:
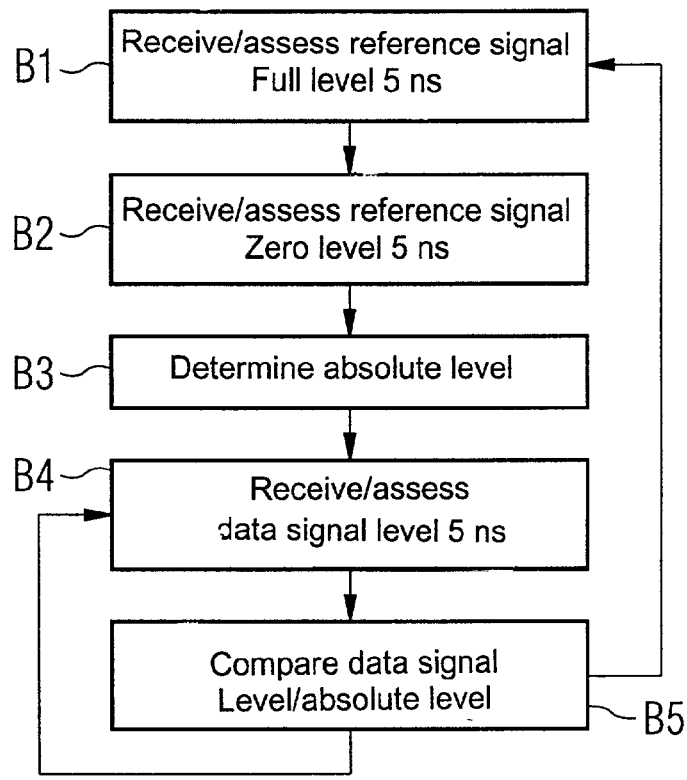
FIG. 5 shows an inventive signal decoding method.

FIG. 5 shows a possible decoding operation, as can be carried out in the first or second coder/decoder 12, 13. As an example, a system clock period of 10 ns has been chosen, and the signals of the reference signal block and of the data signal block are transmitted on the rising and falling pulse edges of the system clock. The level-independent signal level assessment is made when a sequence including a reference signal block and a data signal block is received. The first received reference signal in the reference signal block corresponds to the full signal level for data transmission and is assessed for 5 ns in step B1. Next, the second received reference signal of the reference signal block with the zero signal level is assessed in step B2 over a period of 5 ns. The absolute level swing is then ascertained from the assessed full signal level and zero signal level in step B3. Next, the first received data signal with a multiplexed signal level in the data signal block is assessed over a further period of 5 ns in step B4. The assessed signal level is then compared with the absolute level swing in step B5. The further received data signals with multiplexed signal levels are assessed over further periods of 5 ns, and the subsequent comparison is made, until all the data signals in the data signal block have been evaluated. The entire process sequence is then again started from the beginning by assessing the next received reference signal in step B1.

Figure 6:
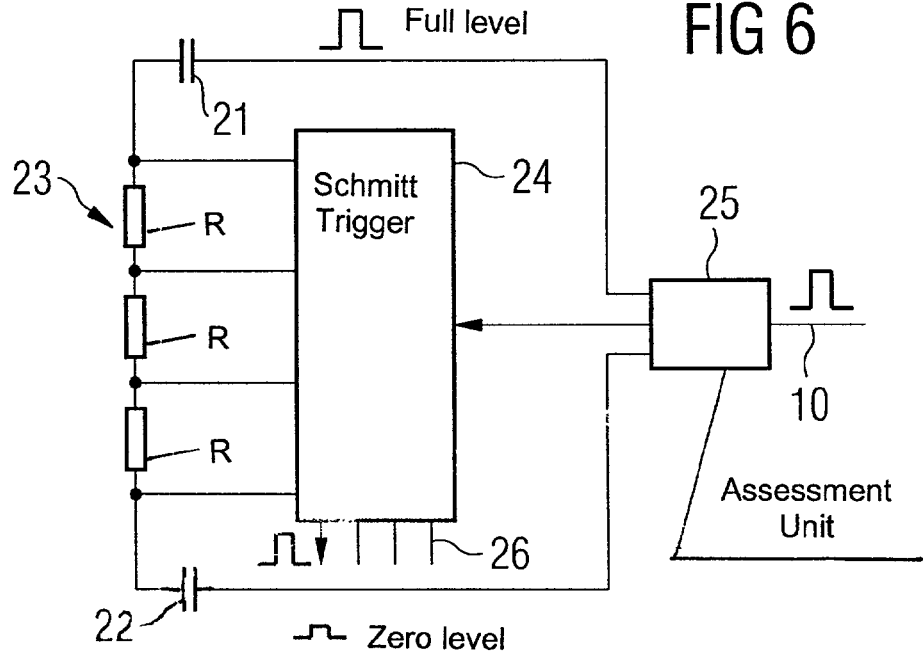
FIG. 6 shows an inventive signal decoder.

FIG. 6 shows one possible embodiment of the decoding unit in the first or second coder/decoder 12, 13. The decoding unit is designed based on the way that an analog/digital converter works and has a first capacitor 21 and a second capacitor 22 with a voltage divider chain 23 arranged between them. The linkage points between the individual series-connected resistors in the voltage divider chain 23 are respectively connected to a schmitt trigger unit 24. The schmitt trigger unit 24 and the two capacitors 21, 22 are also connected to an assessment unit 25. In addition, the schmitt trigger unit 24 has data output channels 26 which are connected to the write/read amplifiers in the input/output circuit 9 for writing to the memory cells 2 of the RAM.

When the assessment unit 25 receives a reference signal block with a full level reference signal and a zero level reference signal via the transfer path 10, the assessment unit 25 outputs these two levels to the capacitors 21, 22 in order to charge the capacitor 21 with the maximum level and to charge the capacitor 22 with the minimum level. The capacitor voltages are then stabilized, and having been amplified, are applied to the voltage divider chain 23. If a data signal block with the multiplexed data signals is then received by the assessment unit 25 after the reference signal block, the assessment unit 25 supplies the individual data signals having the coded signal level to the schmitt trigger unit 24, which compares the supplied signal levels with the voltages applied via the voltage divider chain 23. If the schmitt trigger unit 24 then responds to a voltage divider signal, the signal level is assessed on the basis of this voltage signal and is coded into the associated data sequence and output on the appropriate data output channel 26 by the schmitt trigger unit.

Figure 7:
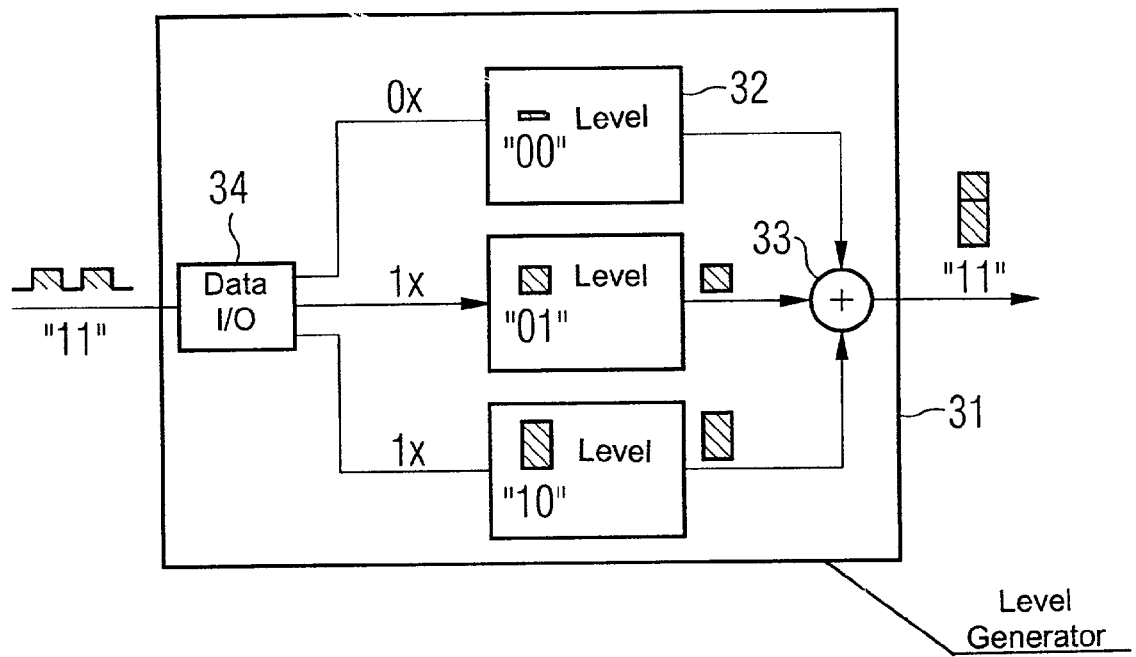
FIG. 7 shows an inventive signal coding method.

FIG. 7 shows a possible coding method for producing a multiplexed signal level for a data signal, as can be carried out by the first and the second coding/decoding unit 12, 13. In this case, the coding unit includes a level generator 31 having various signal units 32 which respectively produce a signal which has a particular level magnitude and a particular associated data sequence. Thus, for two-bit level multiplexing, for example, as shown in FIG. 7, three signal units 32 are provided, a first signal unit outputting a zero level, for a bit sequence "00", a second signal unit outputting a 0.4 V level for a bit sequence "01", and a third signal unit outputting a 0.8 V level for a bit sequence "10". When a data sequence is received on a data input/output 34, the individual signal units 32 of the level generator 31 are actuated based on the prescribed bit sequence on the respective input channel, and then output the associated level magnitude to an adder 33, which then produces a sum level which is output as multiplexed signal level in the data signal block.

Figure 8:
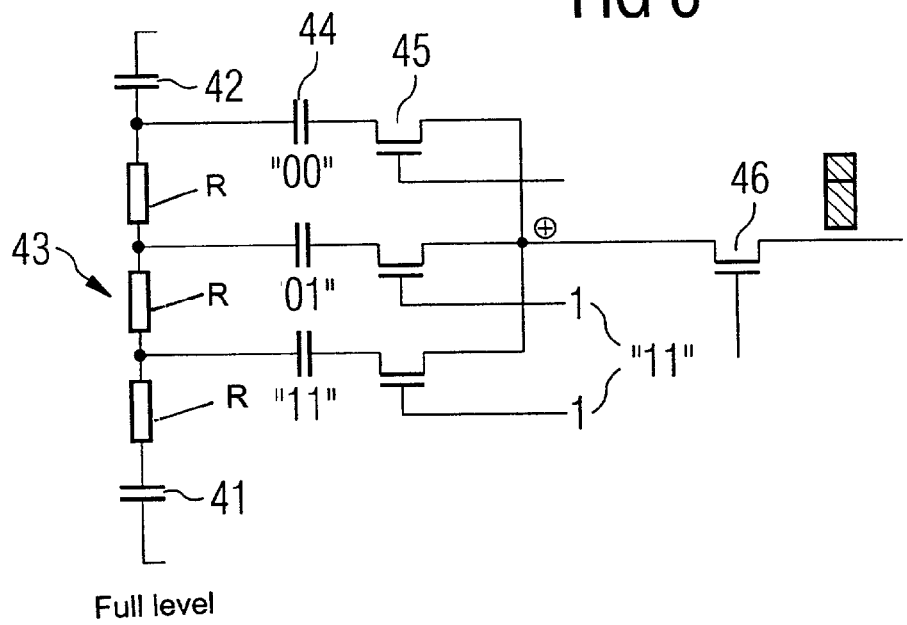
FIG. 8 shows an inventive signal coder.

FIG. 8 shows one possible hardware embodiment for the coding unit shown in FIG. 7. In this case, the level generator 31 is in the form of a voltage divider chain 43 that is connected between two capacitors 41, 42. The full level and the zero level are applied to the voltage divider chain 43 for data transmission. The voltage divider chain 43 between the two capacitors 41, 42 includes series-connected resistors between whose linkage points capacitors 44 are respectively connected in parallel. The resistors split the voltage prescribed by full levels and zero levels on the capacitors 41, 42, preferably equidistantly, in order to produce the individual level magnitudes across the capacitors 44. These level magnitudes are then applied to the adder 33 using transistors 45 connected in series with the individual capacitors 44. The switching operation is performed by applying the appropriate signals on the channels of the data input/output to the respective transistor gates. The summed level produced on the adder 33 is output onto the transfer path 10 in sync with the clock signal. The output is controlled with the aid of a further, interposed transistor 46.

The features of the invention which have been disclosed in the description above, in the claims and in the drawing may be used both individually and in any desired combination in their fundamental capacity for implementing the invention in its various embodiments.

I claim:

1. A method for transmitting data on a transfer path of a semiconductor component, which comprises:
    coding a data sequence to set a signal level of a data signal and thereby obtaining a coded data signal having the signal level;
    transmitting the coded data signal on the transfer path in sync with a clock signal;
    on the transfer path, transmitting a reference signal block having at least one reference signal level;
    decoding the transmitted coded data signal by assessing the signal level of the transmitted coded data signal and thereby ascertaining the data sequence;
    performing the step of assessing the signal level of the transmitted coded data signal by comparing the reference signal level with the signal level of the transmitted coded data signal; and
    initializing the step of transmitting the coded data signal on the transfer path by transmitting a test data sequence to set a feature selected from the group consisting of an optimum number of multiplexed data signals that are in a data signal block and an optimum number of multiplex steps for stipulating signal levels of the multiplexed data signals.

2. The method according to claim 1, which comprises performing the step of transmitting the reference signal block by transmitting, in the reference signal block, a reference signal having a maximum possible level magnitude.

3. The method according to claim 2, which comprises performing the step of transmitting the reference signal block by transmitting, in the reference signal block, a further reference signal having a minimum possible level magnitude.

4. The method according to claim 3, which comprises alternately transmitting the reference signal and the coded data signal in sync with the clock signal.

5. The method according to claim 3, which comprises alternately transmitting the reference signal and the coded data signal on a rising pulse edge and on a falling pulse edge of the clock signal.

6. The method according to claim 2, which comprises alternately transmitting the reference signal and the coded data signal in sync with the clock signal.

7. The method according to claim 2, which comprises alternately transmitting the reference signal and the coded data signal on a rising pulse edge and on a falling pulse edge of the clock signal.

8. The method according to claim 1, which comprises performing the step of transmitting the reference signal block by transmitting, in the reference signal block, a signal sequence including a reference signal with a minimum possible level magnitude and a reference signal with a maximum possible level magnitude.

9. The method according to claim 8, which comprises:
defining a data signal block including at least one data signal; and
alternately transmitting the signal sequence of the reference signal block and the data signal block in sync with the clock signal.

10. The method according to claim 8, which comprises:
defining a data signal block including at least one data signal; and
alternately transmitting the signal sequence of the reference signal block and the data signal block in sync with the clock signal on a rising pulse edge and on a falling pulse edge.

11. The method according claim 1, which comprises:
outputting the test data sequence onto the transfer path as a predetermined number of data signals having multiplexed signal levels;
obtaining a decoded test data sequence by assessing the multiplexed signal levels of the data signals based on at least one reference signal in a previously transmitted reference signal block;
coding the decoded test data sequence to obtain another coded test data sequence;
transmitting the other coded test data sequence after transmitting a reference signal block;
decoding the other coded test data sequence to determine whether a correct transmission operation has been carried out; and
based on the determination, iteratively adjusting a feature, selected from the group consisting of the optimum number of the multiplexed data signals in the data signal block and the optimum number of the multiplex steps for stipulating the signal level of the multiplexed data signals, until a maximum data transfer rate is established at which the data signals are transmitted with an errorfree signal level assessment.

12. The method according to claim 1, which comprises providing the transfer path as a path selected from the group consisting of an internal transfer path of a semiconductor memory and an external transfer path of the semiconductor memory.

13. An apparatus for data transmission on a transfer path of a semiconductor component, comprising:
a first coder/decoder for coding a data sequence by setting a signal level of a data signal and thereby obtaining a coded data signal having the signal level, said first coder/decoder also designed to produce a reference signal block having at least one reference signal level;
a bi-directional transfer path for transmitting the coded data sighal in sync with a clock signal and for transmitting the reference signal level;
a second coder/decoder for decoding the transmitted coded data signal by assessing the signal level of the transmitted coded data signal to ascertain the data sequence that has been transmitted, said second coder/decoder designed to compare the signal level of the transmitted coded data signal with the reference signal level in order to assess the signal level of the transmitted coded data signal; and
an initialization unit for initializing data transmission on said transfer path in order to transmit a test data sequence bi-directionaliy between said first coder/decoder and said second coder/decoder;
said initialization unit assessing a result of the transmission of the test data sequence to set a feature selected from the group consisting of an optimum number of multiplexed data signals in a data signal block and an optimum number of multiplex steps; and
the feature being for stipulating a signal level of the multiplexed data signals.

14. The apparatus according to claim 13, comprising:
a decoding unit including a first capacitor, a second capacitor, and a first voltage divider chain connected between said first capacitor and said second capacitor, said first voltage divider chain including a first group of impedance elements connected in series and including nodes located between said impedance elements of said first group of impedance elements, said voltage divider chain providing voltages;
a Schmitt trigger unit connected to said nodes of said first voltage divider chain; and
an assessment unit connected to said Schmitt trigger unit, said first capacitor, and said second capacitor;
said Schmitt trigger unit having data output channels;
if said assessment unit receives the reference signal block via said transfer path and the reference signal block has a full-level reference signal and a zero-level reference signal, then;
said assessment unit outputs the full-level to said first capacitor to charge said first capacitor with a first capacitor voltage having a maximum level,
said assessment unit outputs the zero level to said second capacitor to charge said second capacitor to a second capacitor voltage having a minimum level, and
said first capacitor voltage and said second capacitor voltage are applied to said first voltage divider chain;
if after receiving the reference signal block, said assessment unit then receives the coded data signal having the signal level, said assessment unit supplies the coded data signal to said Schmitt trigger unit which compares the signal level of the coded data signal with the voltages provided by said voltage divider chain to code the associated data sequence and to output the data sequence on an appropriate one of the data channels; and
said decoding unit being configured in a component selected from the group consisting of said first coder/decoder and said second coder/decoder.

15. The apparatus according to claim 14, which comprises:
a coding unit including a third capacitor, a fourth capacitor, and a second voltage divider chain connected between said third capacitor and said fourth capacitor, said second voltage divider chain including a second group of impedance elements connected in series and including nodes located between said impedance elements, said third capacitor having a maximum level being applied thereto, said fourth capacitor having a minimum level applied thereto;
a plurality of capacitors, each one of said plurality of said capacitors connected to a respective one of said nodes of said voltage divider chain;
an adder; and
a plurality of transistors connected in series with said plurality of said capacitors to individually connect said plurality of said capacitors to said adder;
said adder producing a sum level and outputting the sum level onto said transfer path in sync with the clock signal; and
said coding unit being configured in a component selected from the group consisting of said first coder/decoder and said second coder/decoder.

16. The apparatus according to claim 13, which comprises:
- a coding unit including a first capacitor, a second capacitor, and a voltage divider chain connected between said first capacitor and said second capacitor, said voltage divider chain including impedance elements connected in series and including nodes located between said impedance elements, said first capacitor having a maximum level being applied thereto, said second capacitor having a minimum level applied thereto;
- a plurality of capacitors, each One of said plurality of said capacitors connected to a respective one of said nodes of said voltage divider chain;
- an adder; and
- a plurality of transistors connected in series with said plurality of said capacitors to individually connect said plurality of said capacitors to said adder;
- said adder producing a sum level and outputting the sum level onto said transfer path in sync with the clock signal; and
- said coding unit being configured in a component selected from the group consisting of said first coder/decoder and said second coder/decoder.

17. The apparatus according to claim 13, wherein:
- said initialization unit prescribes a start transfer protocol for said first coder/decoder, the start transfer protocol defines a predetermined number of the multiplexed data signals that are in the data signal block, the multiplexed data signals have signal levels, the start transfer protocol also defines a predetermined number of multiplex steps for stipulating the signal levels of the multiplexed data signals;
- said first coder/decoder codes the test data sequence into a first data signal block in dependence on the start transfer protocol such that the first data signal block has the predetermined number of the multiplexed data signals, said first coder/decoder outputs the first data signal block and the reference signal block to said second coder/decoder via said transfer path;
- said second coder/decoder assesses the signal levels of received onesof the multiplexed data signals in the first data signal block in dependence on the reference signal in the reference signal block in order to decode the test data sequence and thereby obtain a decoded test data sequence, said second coder/decoder then codes the decoded test data sequence into a second data signal block and transmits the second data signal block and the reference signal block back to said first coder/decoder;
- said first coder/decoder decodes the signal levels of the received ones of the multiplexed data signals in the second data signal block in dependence on the reference signal in the reference signal block to determine whether a correct transmission operation has been carried out; and
- based on the determination, said initialization unit iteratively adjusts an item selected from the group consisting of the predetermined number of the multiplexed data signals and the predetermined number of the multiplex steps until a maximum data transfer rate is established at which the determination still indicates that a correct transmission operation has been carried out.

18. The apparatus according to claim 13, in combination with a semiconductor memory having an internal transfer path and an external transfer path, wherein said bi-directional transfer path is selected from the group consisting of the internal transfer path and the external transfer path.

* * * * *